United States Patent
Chiang

(10) Patent No.: US 12,355,419 B2
(45) Date of Patent: Jul. 8, 2025

(54) COMMON MODE FILTER AND SIGNAL TRANSMISSION CIRCUIT

(71) Applicants: INVENTEC (PUDONG) TECHNOLOGY CORPORATION, Shanghai (CN); INVENTEC CORPORATION, Taipei (TW)

(72) Inventor: Chih-Chien Chiang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 218 days.

(21) Appl. No.: 18/210,479

(22) Filed: Jun. 15, 2023

(65) Prior Publication Data
US 2024/0313379 A1   Sep. 19, 2024

(30) Foreign Application Priority Data

Mar. 14, 2023   (CN) .......................... 202310246247.0

(51) Int. Cl.
| | |
|---|---|
| H03H 7/42 | (2006.01) |
| H01P 1/20 | (2006.01) |
| H01P 3/08 | (2006.01) |
| H03H 1/00 | (2006.01) |
| H03H 7/01 | (2006.01) |

(52) U.S. Cl.
CPC ............... H03H 7/427 (2013.01); H01P 1/20 (2013.01); H01P 3/08 (2013.01); H03H 7/0115 (2013.01); *H03H 1/0007* (2013.01)

(58) Field of Classification Search
CPC ...... H03H 1/0007; H03H 7/425; H03H 7/427; H03H 7/0115; H01P 1/20
USPC ................................ 333/4, 5, 175, 181, 185
See application file for complete search history.

(56) References Cited

U.S. PATENT DOCUMENTS

2019/0341902 A1* 11/2019 Yoneda .................. H03H 7/425

* cited by examiner

*Primary Examiner* — Rakesh B Patel
(74) *Attorney, Agent, or Firm* — Maschoff Brennan

(57) ABSTRACT

A common mode filter comprises a substrate, a first conductive layer, a ground layer, two conductive lines and two passive components. The substrate has a first surface, a second surface and a plurality of through holes, wherein the plurality of through holes respectively pass through the first surface and the second surface. The first conductive layer is disposed on the first surface of the substrate. The ground layer is disposed on the first surface of the substrate and spaced from the first conductive layer. The two conductive lines are disposed on the second surface of the substrate, wherein one end of each of the two conductive lines is electrically connected to the first conductive layer through one of the plurality of through holes. The two passive components are electrically connected to the ground layer and the first conductive layer.

8 Claims, 10 Drawing Sheets

COMMON MODE FILTER AND SIGNAL TRANSMISSION CIRCUIT

CROSS-REFERENCE TO RELATED APPLICATIONS

This non-provisional application claims priority under 35 U.S.C. § 119(a) on Patent Application No(s). 202310246247.0 filed in China on Mar. 14, 2023, the entire contents of which are hereby incorporated by reference.

BACKGROUND

1. Technical Field

This disclosure relates to a common mode filter and signal transmission circuit, especially to a common mode filter and signal transmission circuit applicable to differential-signal lines.

2. Related Art

With the evolution of high-speed digital signal transmission in recent years, in order to achieve transmission requirements, the clock of the differential-signal line pair progresses toward higher frequencies. Along with this, the high-frequency noise interfering with communication products has also increased, especially the common-mode signal of the differential-signal line pair, which is one of the major noise sources in electronic products today.

The traditional common-mode noise suppression method uses common mode filter components. The disadvantage is that it will cause signal discontinuity, and it can be used only for one single frequency without a degree of freedom for adjustment. When there is a frequency offset caused by parasitic effects, it is not easy to correct or calibrate, and additional costs may be inevitable.

SUMMARY

Accordingly, this disclosure provides a common mode filter and signal transmission circuit.

According to one or more embodiment of this disclosure, a common mode filter comprises a substrate, a first conductive layer, a ground layer, two conductive lines and two passive components. The substrate has a first surface, a second surface and a plurality of through holes, wherein the first surface and the second surface are opposite to each other, and the plurality of through holes respectively pass through the first surface and the second surface. The first conductive layer is disposed on the first surface of the substrate. The ground layer is disposed on the first surface of the substrate and spaced from the first conductive layer. The two conductive lines are disposed on the second surface of the substrate, wherein one end of each of the two conductive lines is electrically connected to the first conductive layer through one of the plurality of through holes. The two passive components are electrically connected to the ground layer and the first conductive layer.

According to one or more embodiment of this disclosure, a signal transmission circuit comprises a common mode filter and two differential-signal lines. The common mode filter comprises a substrate, a first conductive layer, a ground layer, two conductive lines and two passive components. The substrate has a first surface, a second surface and a plurality of through holes, wherein the first surface and the second surface are opposite to each other, and the plurality of through holes respectively pass through the first surface and the second surface. The first conductive layer is disposed on the first surface of the substrate. The ground layer is disposed on the first surface of the substrate and spaced from the first conductive layer. The two conductive lines are disposed on the second surface of the substrate, wherein one end of each of the two conductive lines is electrically connected to the first conductive layer through one of the plurality of through holes. The two passive components are electrically connected to the ground layer and the first conductive layer. The two differential-signal lines are disposed on the second surface of the substrate and located between the two conductive lines.

In view of the above description, the common mode filter and the signal transmission circuit of the present disclosure may filter out the common-mode signal transmitted in the differential-signal lines and can adjust the frequency band of filtering through passive components, so that high impedance may be presented over the common-mode signal at a specific resonance frequency, thereby achieving the effect of suppressing noise.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

Figure 1:
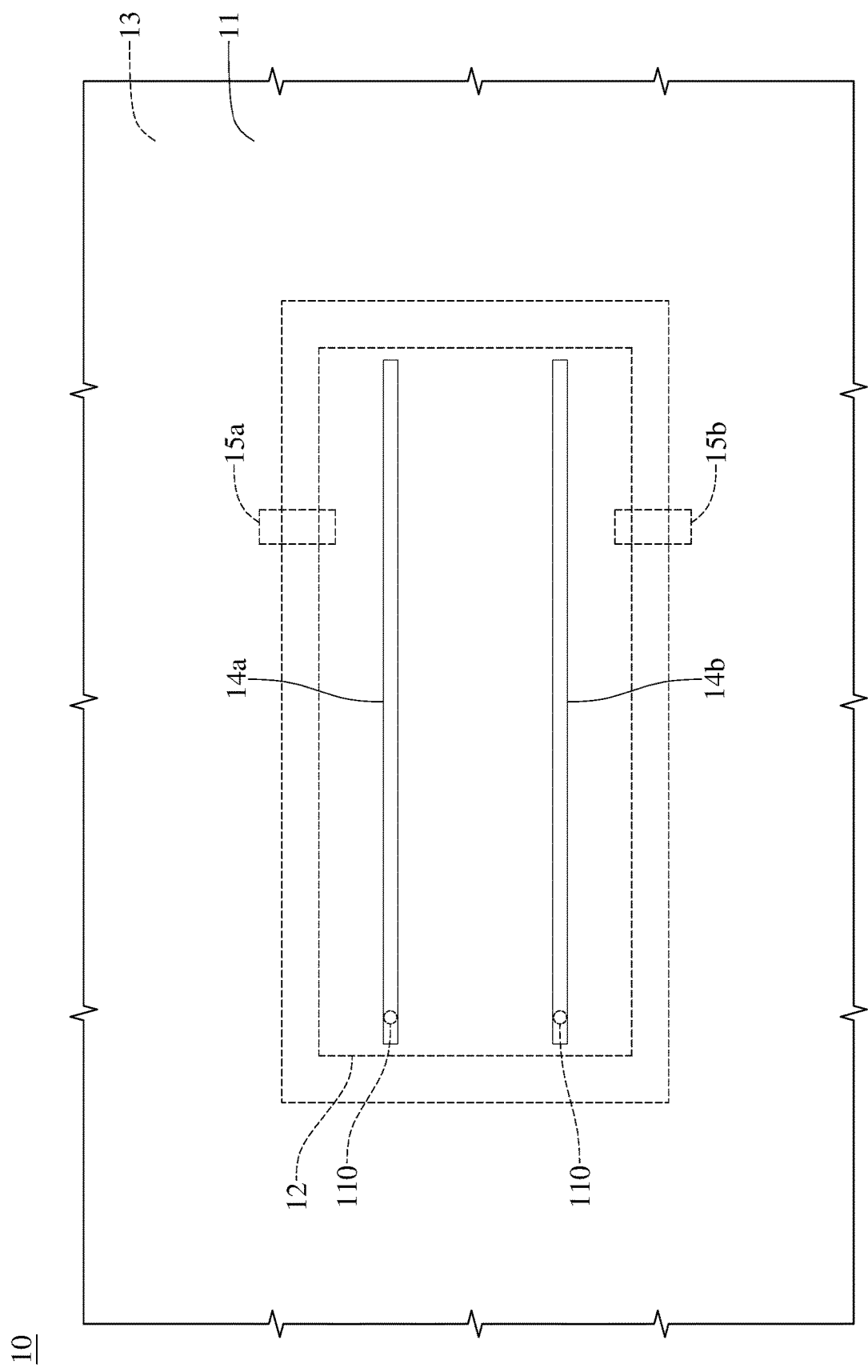
FIG. 1 is a top view of the common mode filter according to an embodiment of the present disclosure.

Please refer to FIG. 1 which is a top view of the common mode filter according to an embodiment of the present disclosure. As shown in FIG. 1, the common mode filter 10 comprises a substrate 11, a first conductive layer 12, a ground layer 13, two conductive lines 14a and 14b, and two passive components 15a and 15b. The substrate 11 has a first surface, a second surface and a plurality of through holes 110, wherein the first surface and the second surface are opposite to each other, and the plurality of through holes 110 respectively pass through the first surface and the second surface. The first conductive layer 12 is disposed on the first surface of the substrate 11. The ground layer 13 is disposed on the first surface of the substrate 11 and spaced from the first conductive layer 12. The two conductive lines 14a and 14b are disposed on the second surface of the substrate 11, wherein one end of each of the two conductive lines 14a and 14b is electrically connected to the first conductive layer 12 through one of the plurality of through holes 110. The two passive components 15a and 15b are electrically connected to the ground layer 13 and the first conductive layer 12.

In the present embodiment, the substrate 11 may be a printed circuit board (PCB) substrate, and its material may be glass fiber material (FR4) or ceramic material, which is not limited herein. The first conductive layer 12 and the ground layer 13 may be metal layers, such as copper layers, which is not limited herein. The shape of the first conductive layer 12 is not limited to the rectangle shown in FIG. 1. Opposite to the side with the first conductive layer 12 and the ground layer 13, the other side of the substrate 11 is provided with two conductive lines 14a and 14b respectively connected to the through holes 110 connected to the first conductive layer 12. Between the first conductive layer 12 and the ground layer 13, two passive components 15a and 15b are disposed. The passive components 15a and 15b may be disposed on the same surface of the substrate 11 where the first conductive layer 12 is disposed and may cross between the first conductive layer 12 and the ground layer 13. Alternatively, the passive components 15a and 15b may be disposed on different surfaces of the substrate 11 from where the first conductive layer 12 is disposed (for example, the surface on which the two conductive lines 14a and 14b are disposed), and may cross between the first conductive layer 12 and the ground layer 13 through additional through holes (not shown).

Preferably, the two conductive lines 14a and 14b are mirror-symmetric to each other and extend along a same direction more or less, and the two passive components 15a and 15b are mirror-symmetric to each other. Each of the passive components 15a and 15b may include at least one of an inductor and a capacitor, or an electrical component with some specific impedance. Further, the plane of symmetry (not shown) of the two conductive lines 14a and 14b may be the same as the plane of symmetry of the two passive components 15a and 15b. The electrical characteristics of the passive components 15a and 15b may be identical to each other, for example, both components are inductors with the same inductance, or capacitors with the same capacitance, or components with the same impedance. For example, the passive components 15a and 15b of the present embodiment may be inductors with an inductance of 1.2 nH.

Figure 2:
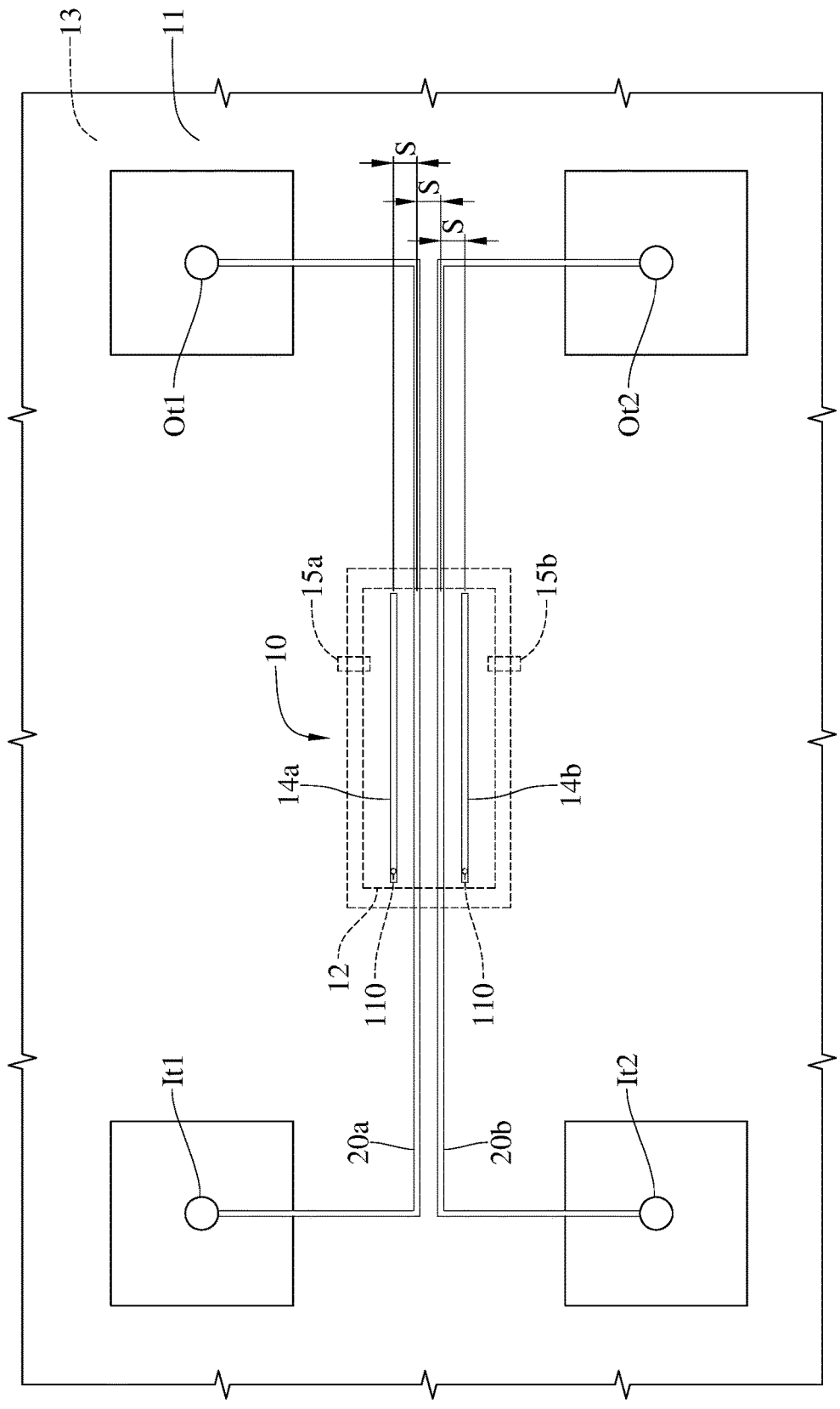
FIG. 2 is a top view of the signal transmission circuit according to an embodiment of the present disclosure.

Please refer to FIG. 2 which is a top view of the signal transmission circuit according to an embodiment of the present disclosure. As shown in FIG. 2, the signal transmission circuit 1 comprises a common mode filter 10 and two differential-signal lines 20a and 20b. The common mode filter 10 comprises a substrate 11, a first conductive layer 12, a ground layer 13, two conductive lines 14a and 14b and two passive components 15a and 15b. The substrate 11 has a first surface, a second surface and a plurality of through holes 110, wherein the first surface and the second surface are opposite to each other, and the plurality of through holes 110 respectively pass through the first surface and the second surface. The first conductive layer 12 is disposed on the first surface of the substrate 11. The ground layer 13 is disposed on the first surface of the substrate 11 and spaced from the first conductive layer 12. The two conductive lines 14a and 14b are disposed on the second surface of the substrate 11, wherein one end of each of the two conductive lines 14a and 14b is electrically connected to the first conductive layer 12 through one of the plurality of through holes 110. The two passive components 15a and 15b are electrically connected to the ground layer 13 and the first conductive layer 12. The two differential-signal lines 20a and 20b are disposed on the second surface of the substrate 11 and located between the two conductive lines 14a and 14b.

In the present embodiment, the configuration of the common mode filter 10 is the same as that described in FIG. 1, which is not repeated herein. The differential-signal lines 20a and 20b disposed on the substrate may be mirror-symmetric to each other. Preferably, the differential-signal lines 20a and 20b and the conductive lines 14a and 14b may be arranged with an equal interval, that is, the distance S between the differential-signal line 20a and the conductive line 14a, the distance S between the conductive line 14a and the conductive line 14b, and the distance S between the conductive line 14b and the differential-signal line 20b may be equal. The differential-signal lines 20a and 20b are configured to transmit two differential signals input from signal input terminals It1 and It2 to signal output terminals Ot1 and Ot2 respectively. The signals transmitted by the differential-signal lines 20a and 20b may also include common-mode signals, wherein the common-mode signals are the main source of noise. That is, the common-mode signal may be filtered out through the common mode filter and the signal transmission circuit of the present disclosure, and the common mode signal of a specific frequency may also be suppressed, which is further explained in the following descriptions.

Figure 3A:
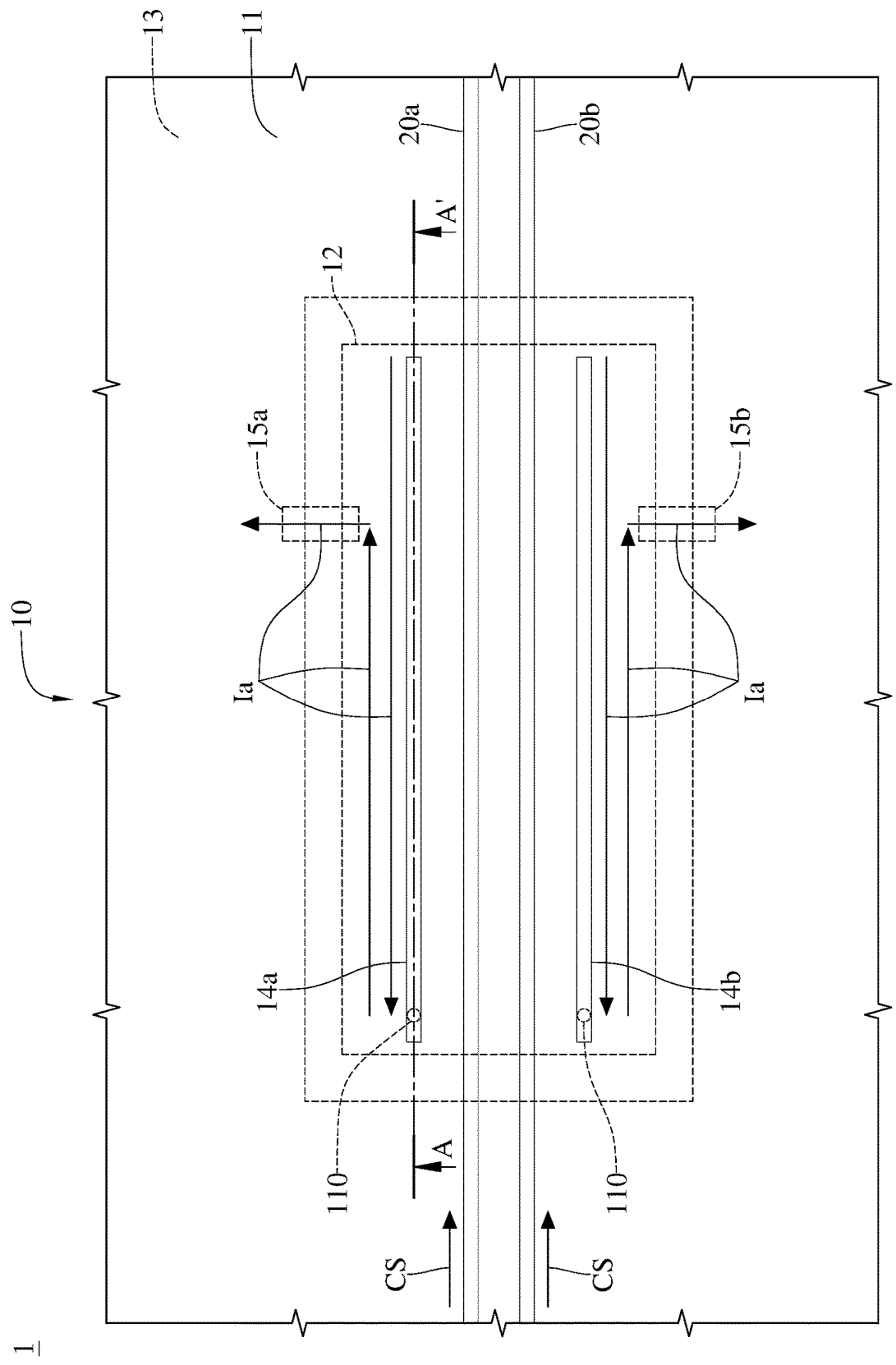
FIG. 3A schematically illustrates generating coupling current according to an embodiment of the present disclosure.
Figure 3B:
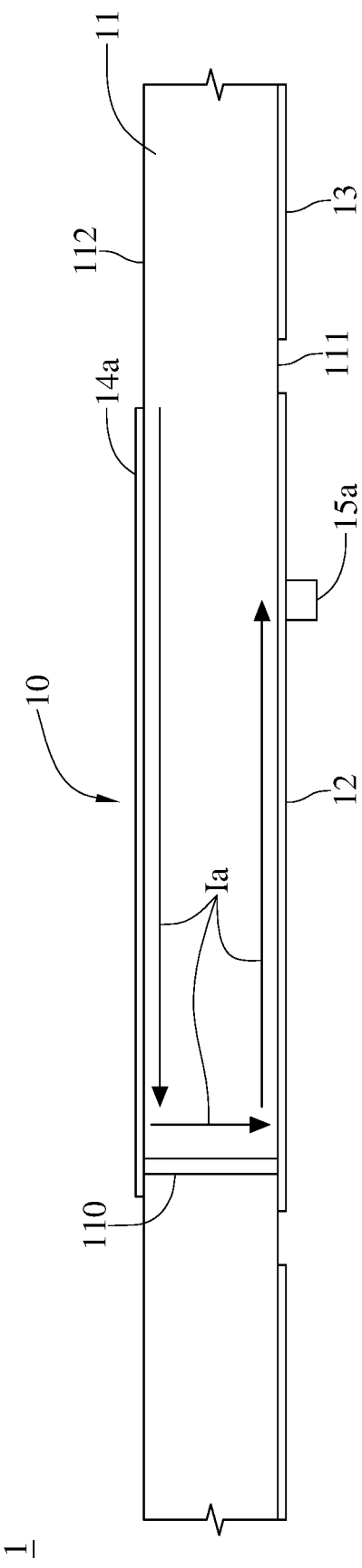
FIG. 3B schematically illustrates the path of coupling current shown along the section A-A' of FIG. 3A.

Please refer to FIG. 3A and FIG. 3B along with FIG. 2, wherein FIG. 3A schematically illustrates generating coupling current according to an embodiment of the present disclosure, and FIG. 3B schematically illustrates the path of coupling current shown along the section A-A' of FIG. 3A. As shown in FIG. 3A and FIG. 3B, the first conductive layer 12 and the ground layer 13 are disposed on the first surface 111 of the substrate 11, and the conductive lines 14a and 14b are disposed on the second surface 112 of the substrate 11. In the signal transmission circuit 1, when the common-mode signals CS are transmitted through the differential-signal lines 20a and 20b, the coupling currents Ia and Ib can flow from the ends of the conductive lines 14a and 14b of the common mode filter 10 to the ground layer 13 through the through holes 110, the first conductive layer 12 and the passive components 15a and 15b. Furthermore, the wavelength of signals transmitted by the differential-signal lines 20a and 20b can be associated with the path lengths of the coupling currents Ia and Ib. Specifically, the path length of the coupling current Ia may be designed to be about a quarter of the wavelength of the signal, that is, the path length of the coupling current traveling through one of the two conductive lines, one of the through holes, the first conductive layer and one of the two passive components may be designed to be about a quarter of the wavelength of the signals transmitted by the two differential-signal lines 20a and 20b. The inductance or capacitance of the passive components 15a and 15b also affects the path length of the coupling current. Therefore, by selecting appropriate passive components 15a and 15b, the effective signal frequency range of the signal transmission circuit can be adjusted. It should be noted that the signal wavelength referred in here can vary with the dielectric constants of different substrate materials, and is not limited to the wavelength of electromagnetic waves propagating in a vacuum environment.

The signals transmitted through the differential-signal lines 20a and 20b mentioned above may include differential signals and common-mode signals, wherein the differential signals are real signals to be retained for application and the common-mode signals are undesired noises. The transmission process of the signal on the differential-signal lines 20a and 20b is affected by the above coupling current and has at least the following two situations: "transmission" and "reflection", wherein "transmission" means that the signals pass through the differential-signal lines 20a and 20b from the input terminals It1 and It2 and are transmitted to the output terminals Ot1 and Ot2, and "reflection" means that the signals cannot be transmitted from the input terminals It1 and It2 to the output terminals Ot1 and Ot2 through the differential signal lines 20a and 20b, and instead, the signals are reflected back to the input terminals It1 and It2.

Figure 4:
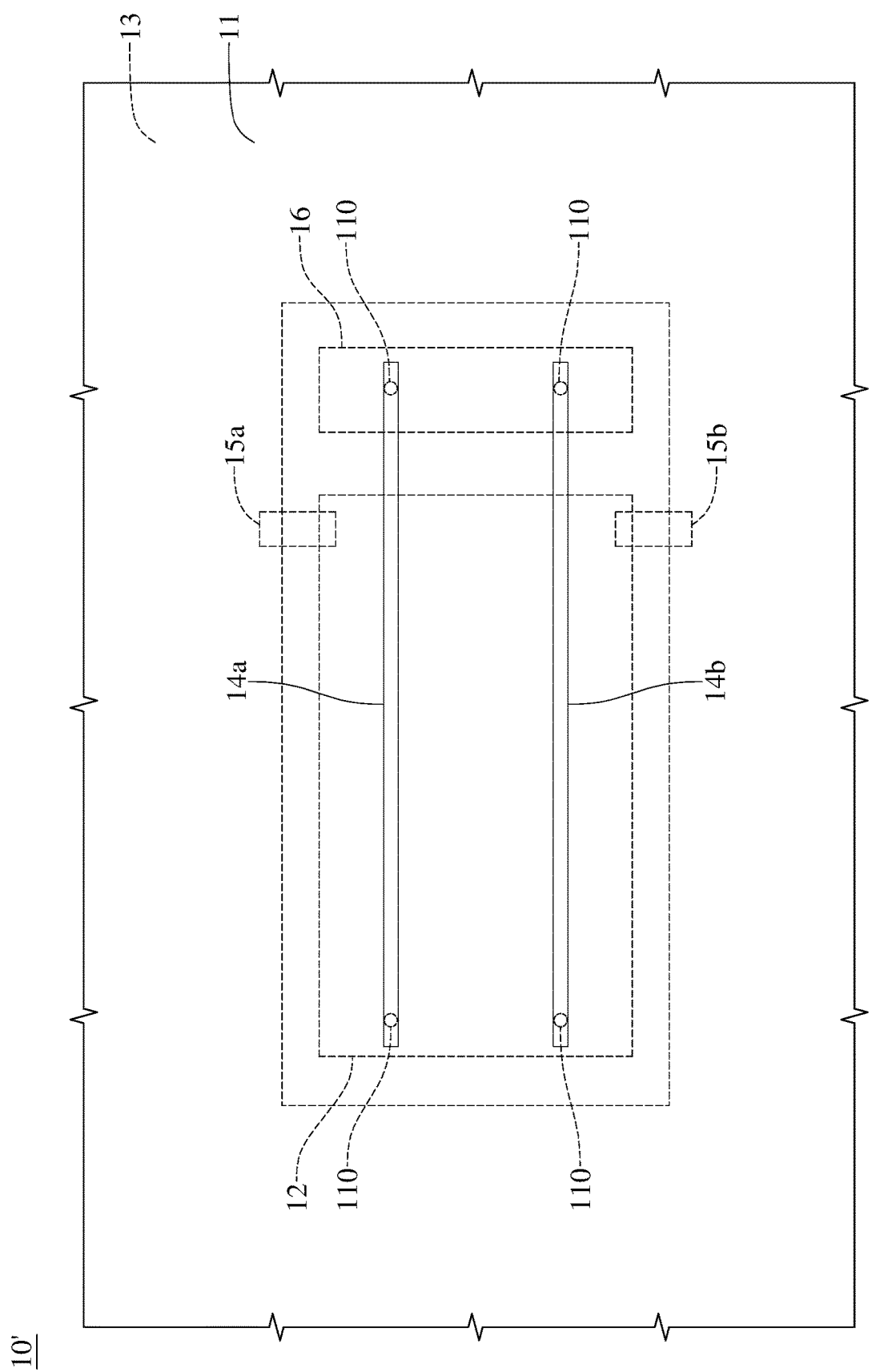
FIG. 4 is a top view of the common mode filter according to another embodiment of the present disclosure.

Please refer to FIG. 4 along with FIG. 1, wherein FIG. 4 is a top view of the common mode filter according to another embodiment of the present disclosure. As shown in FIG. 4, in addition to the same substrate 11, the first conductive layer 12, the ground layer 13, the two conductive lines 14a and 14b and the two passive components 15a and 15b as illustrated in the embodiment of FIG. 1, the common mode filter 10' further comprises a second conductive layer 16. The following descriptions focus on the difference between this embodiment and the above-mentioned embodiment, which is the second conductive layer 16, and the description of other repeated elements can refer to the above-mentioned embodiment, which is omitted herein. The second conductive layer 16 is disposed on the first surface of the substrate 11 (on the same surface where the ground layer 13 and the first conductive layer 12 are located) and is spaced from the first conductive layer 12 and the ground layer 13, wherein the other end of each of the two conductive lines 14a and 14b is electrically connected to the second conductive layer 16 through another one of the plurality of through holes 110. The second conductive layer 16 may be a metal layer that is the same type of metal layer as that of the first conductive layer 12, such as a copper layer.

Figure 5:
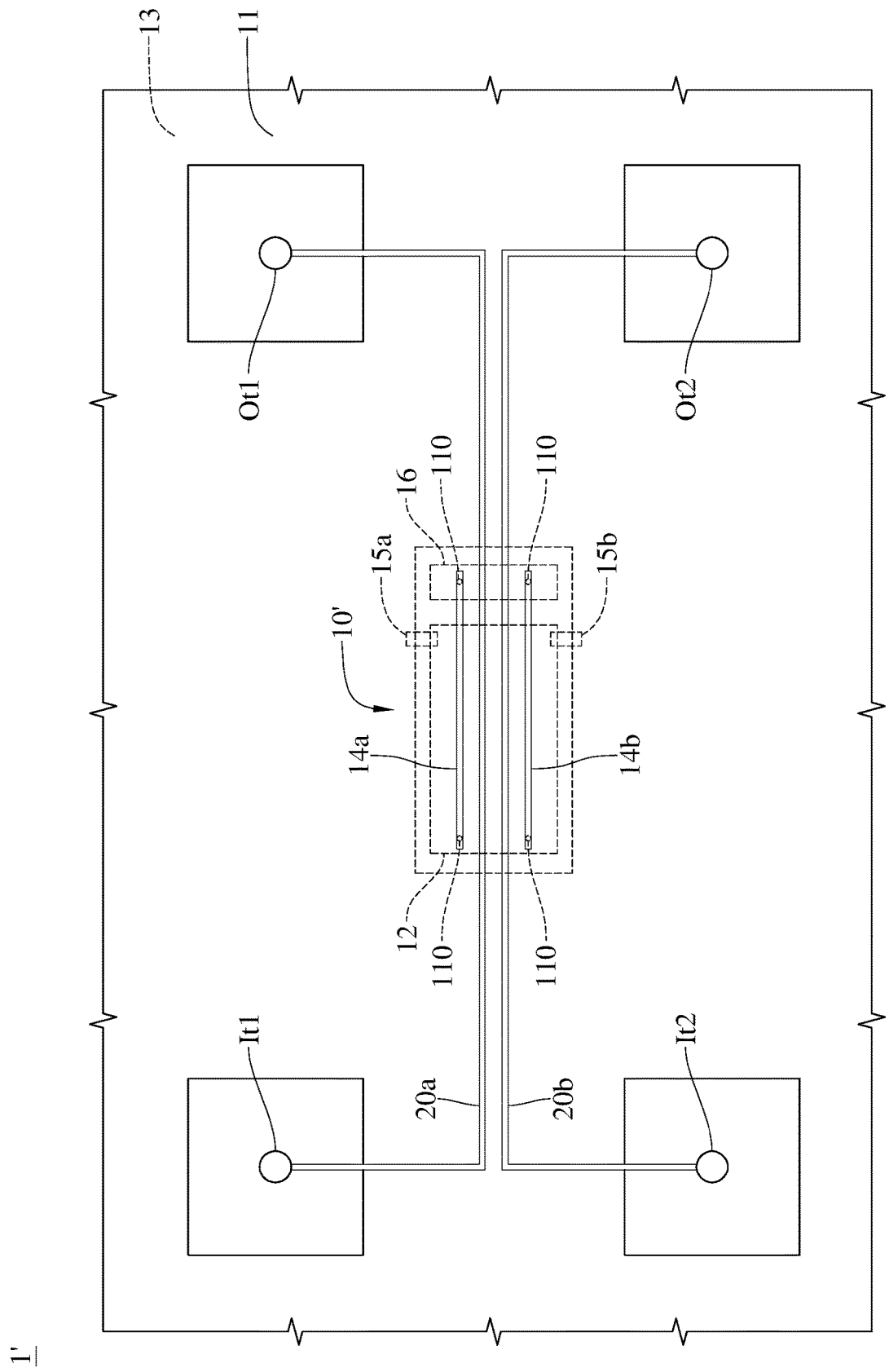
FIG. 5 is a top view of the signal transmission circuit according to another embodiment of the present disclosure.

Please refer to FIG. 5 along with FIG. 2, wherein FIG. 5 is a top view of the signal transmission circuit according to another embodiment of the present disclosure. As shown in FIG. 5, the signal transmission circuit 1' comprises a common mode filter 10' and two differential-signal lines 20a and 20b. The common mode filter 10' comprises a substrate 11, a first conductive layer 12, a ground layer 13, two conductive lines 14a and 14b and two passive components 15a and 15b, wherein the substrate 11 has a first surface and a second surface and a plurality of through holes 110. Compared with the common mode filter 10 of the signal transmission circuit 1 shown in FIG. 2, the common mode filter 10' of the signal transmission circuit 1' shown in FIG. 5 further comprises a second conductive layer 16. In addition, the differential-signal lines 20a and 20b disposed on the substrate 11 may be mirror-symmetric to each other. The differential-signal lines 20a and 20b and the conductive lines 14a and 14b may be arranged with an equal interval, that is, the distance between the differential-signal line 20a and the conductive line 14a, the distance between the conductive line 14a and the conductive line 14b, and the distance between the line 14b and the differential-signal line 20b may be equal.

When signals are transmitted from the differential-signal lines 20a and 20b, the conductive lines 14a and 14b also generate coupling current from the right end thereof, and the coupling current flows to the ground layer 13. In addition, the signal transmission circuit of the present embodiment is additionally provided with the second conductive layer 16 and the corresponding through holes 110, so that the coupling current can form a loop, avoid an accumulation of charges on the ends of the conductive lines, and reduce the possible additional resonance frequency, and can make the filtering effect of the common-mode signal and the transmission efficiency of the differential-signal better.

Figure 6A:
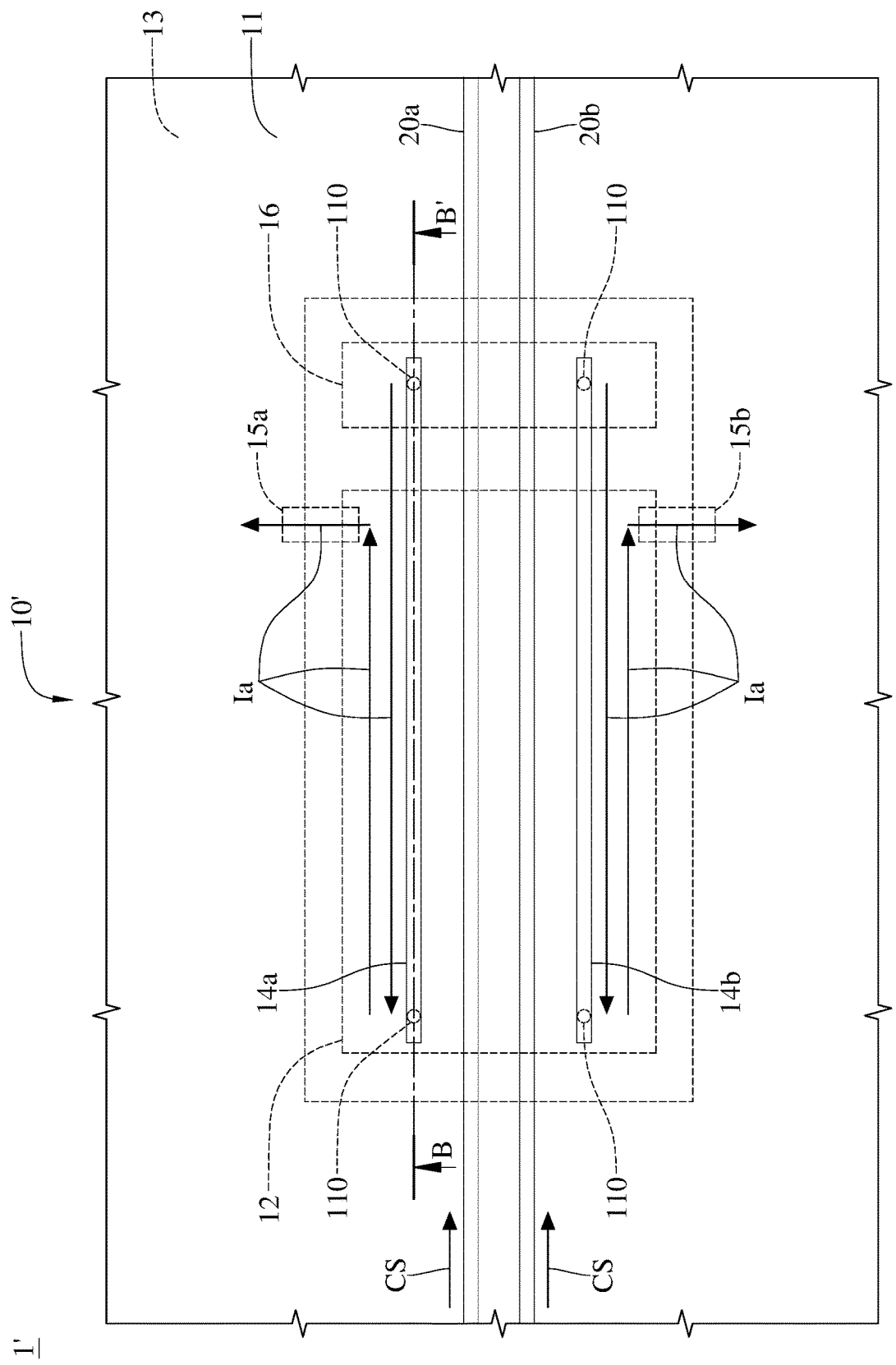
FIG. 6A schematically illustrates generating coupling current according to another embodiment of the present disclosure.
Figure 6B:
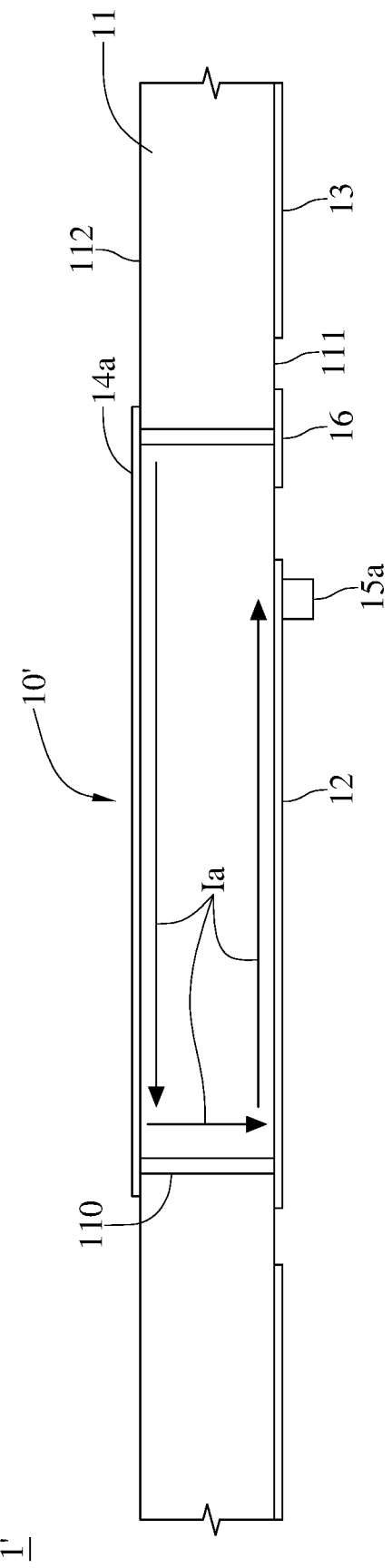
FIG. 6B schematically illustrates the path of coupling current shown along the section B-B' of FIG. 6A.

Please refer to FIG. 6A and FIG. 6B, wherein FIG. 6A schematically illustrates generating coupling current according to another embodiment of the present disclosure, and FIG. 6B schematically illustrates the path of coupling current shown along the section B-B' of FIG. 6A. As shown in FIG. 6A, in the signal transmission circuit 1', when the common-mode signals CS are transmitted through the differential-signal lines 20a and 20b, the coupling currents Ia and Ib will be generated from the ends of the conductive lines 14a and 14b of the common mode filter 10', and pass through the through holes 110, the first conductive layer 12 and the passive components 15a and 15b to flow to the ground layer 13 which has a zero potential. That is, as shown in FIG. 6B, the coupling current Ia flows to the ground layer 13 through the conductive line 14a, the through hole 110, the first conductive layer 12 and the passive component 15a. The coupling current passing through the conductive lines 14a and 14b may also form a loop in the second conductive layer 16 and the corresponding through holes 110 to avoid charge accumulation at the ends of the conductive lines 14a and 14b, and reduce possible additional resonance frequencies. In the present embodiment, the wavelength of signals transmitted through the differential-signal lines is associated with the path length of the coupling current. Specifically, the signals transmitted by the differential-signal lines may resonate with the coupling current, and the resonance condition is that the path length of the coupling current is associated with a quarter of the wavelength of the signal. For example, the path length of the coupling current Ia may be designed to be about a quarter of the wavelength of the signal, that is, the path length of the coupling current is associated with a quarter of the wavelength of the signals transmitted by the two differential-signal lines. It should be noted that the signal wavelength referred in here can vary with the dielectric constants of different substrate materials, and is not limited to the wavelength of electromagnetic waves propagating in a vacuum environment.

Figure 7:
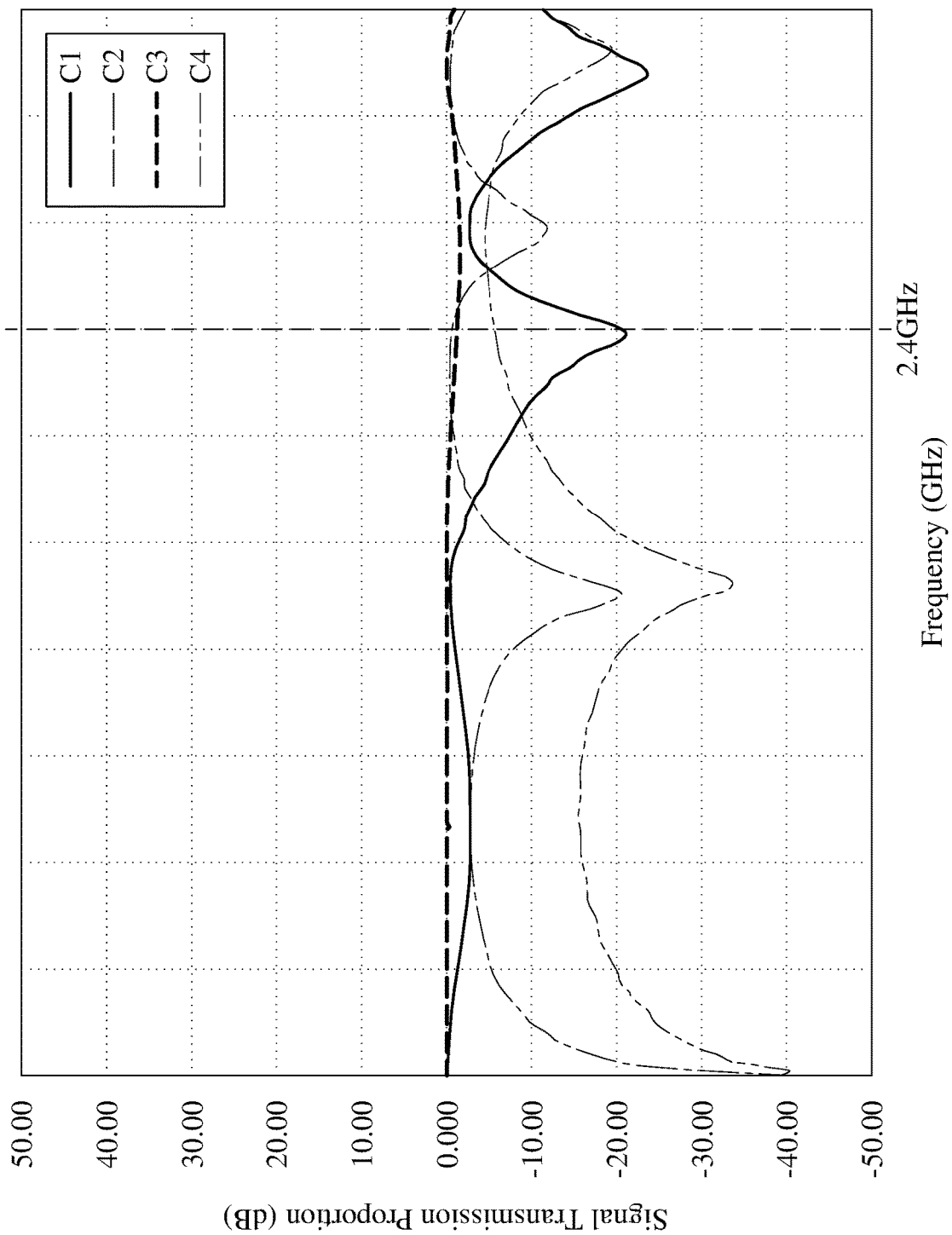
FIG. 7 is a diagram of characteristic curves of the common-mode signal and the differential-mode signal according to another embodiment of the present disclosure.

Please refer to FIG. 7 along with FIG. 5, wherein FIG. 7 is a diagram of characteristic curves of the common-mode signal and the differential-mode signal according to another embodiment of the present disclosure. The four curves shown in FIG. 7 represent different situations of the signal passing through the signal transmission circuit of the present disclosure, among which the data C1 is the signal proportion (dB) of the common-mode signal transmitted from the input terminal to the output terminal at different frequencies, and the data C2 is the signal proportion (dB) of the common-mode signal transmitted from the input terminal and reflected back to the input terminal, the data C3 is the signal proportion (dB) of the differential signal transmitted from the input terminal to the output terminal at different frequencies, and the data C4 is the signal proportion (dB) of the differential signal transmitted from the input terminal and reflected back to the input terminal. As shown in FIG. 5 and FIG. 7, for the differential signals (data C3 and C4), in each frequency interval, the proportion of the differential signals transmitted from the input terminals It1 and It2 to the output terminals Ot1 to Ot2 are quite high, and the proportion of differential signals being reflected back to the input terminals It1 and It2 is very low. This means that the signal transmission circuit in the present disclosure does not affect the transmission of differential signals. For common-mode signals (data C1 and C2), at certain frequencies (such as 2.4 GHz), the proportion of common-mode signals transmitted from input terminals It1 and It2 to output terminals Ot1 to Ot2 is quite low (the filtering effect can reach 20 dB or more), and the proportion of common-mode signals being reflected back to the input terminals It1 and It2 is very high (close to total reflection). This greatly improves the signal-to-noise ratio of the signal transmission circuit in the present disclosure, which means that the common-mode signal of a specific frequency (wavelength) can be filtered out while retaining the differential signal as much as possible. It should be noted that this 2.4 GHz is the resonance frequency of the common mode filter 10. In application, the characteristic curve of the signal transmission circuit can be adjusted by replacing different passive components 15a and 15b (as shown in FIGS. 1 and 2), so as to achieve the effect of optimizing the signal-to-noise ratio in a specific frequency range.

Figure 8:
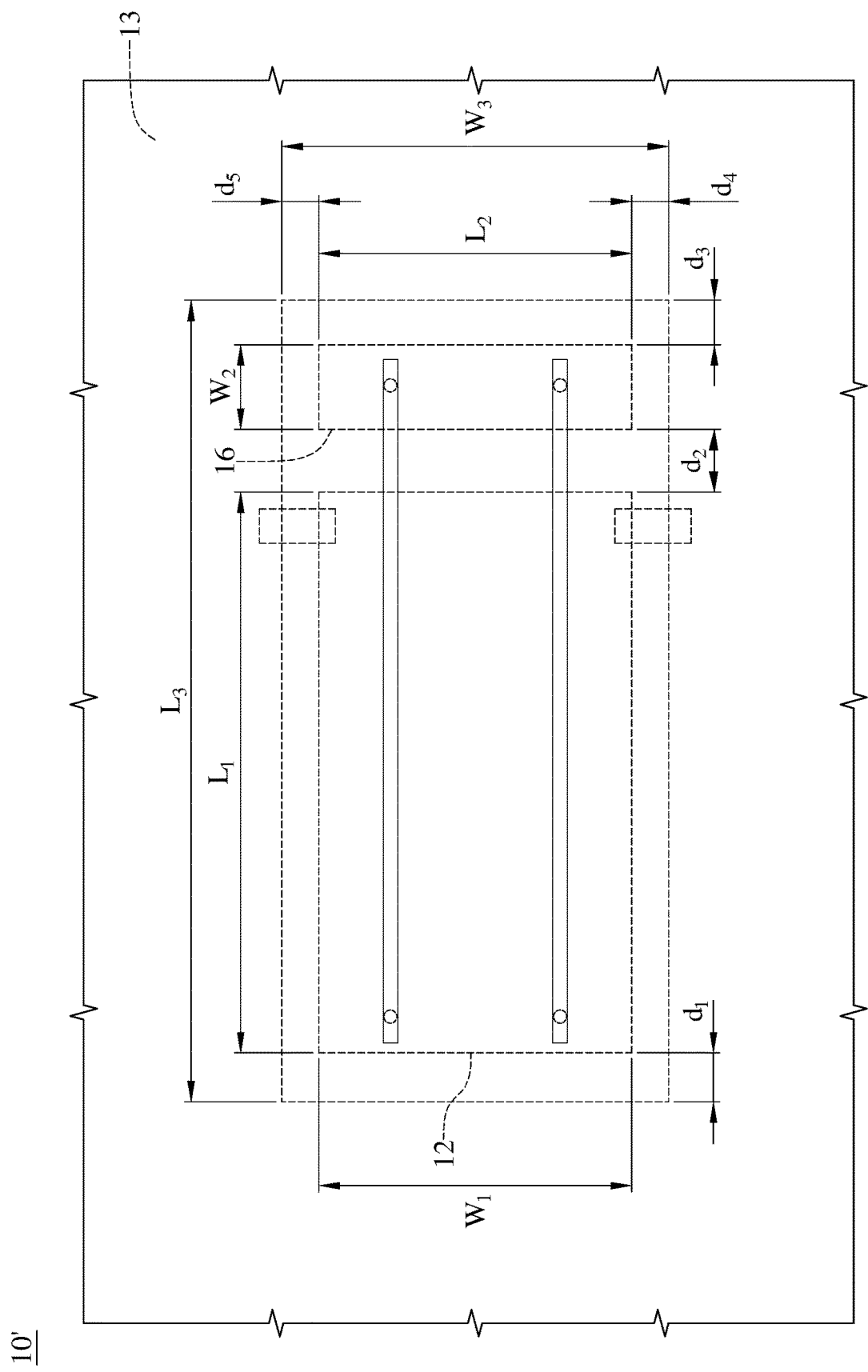
FIG. 8 schematically illustrates the size of the common mode filter shown in FIG. 4.

Please refer to FIG. 8 along with FIG. 4, wherein FIG. 8 schematically illustrates the size of the common mode filter shown in FIG. 4. Exemplarily, the length $L_1$ of the first conductive layer 12 may be 9.7 mm, and the width $W_1$ may be 3.6 mm. The length $L_2$ of the second conductive layer 16 may be 3.6 mm, and the width $W_2$ may be 0.5 mm. The length $L_3$ of the ground layer 13 surrounding the boundaries of the two conductive layers may be 11.4 mm, and the width $W_3$ may be 4.4 mm. The distance $d_1$ between the first conductive layer 12 and the ground layer 13 along the longitudinal direction may be 0.4 mm, the distance $d_2$ between the first conductive layer 12 and the second conductive layer 16 may be 0.4 mm, The distance $d_3$ between the ground layer 13 and the second conductive layer 16 along the longitudinal direction can be 0.4 mm, and the distances $d_4$ and $d_5$ between the ground layer 13 and the two conductive layers along the width direction may be 0.4 mm. The above-mentioned dimensions and sizes of the common-mode filter 10' are particularly suitable for common-mode filtering applications of WiFi signals. It should be noted that the size and ratio in the drawing of the present disclosure are only schematic and may be different from the actual ones. The size of the common mode filter of the present disclosure is not limited to the above examples. Through the design of the path of the coupling current described in the foregoing embodiments and the passive components capable of adjusting frequency, the common mode filter of the present disclosure can also be applied to 5G signals or signals in other frequency ranges.

Through the design of the above-mentioned symmetrical ground structure, high impedance may be presented over the common-mode signals transmitted in the differential-signal lines at a specific resonance frequency. For the effect of the signal transmission circuit of this embodiment on the transmission of differential signals and the suppression of common-mode signals, please refer to FIG. 7 and corresponding description, and is not repeated herein.

In view of the above description, the common mode filter and the signal transmission circuit of the present disclosure may filter out the common-mode signal transmitted in the differential-signal lines and can adjust the frequency band of filtering through passive components, so that high impedance may be presented over the common-mode signal at a specific resonance frequency, thereby achieving the effect of suppressing noise. In addition, the common mode filter and the signal transmission circuit can also cascade with a same structure to achieve the effect of enhanced filtering. Further, through the additional conductive layer, the charge accumulation and unnecessary resonance phenomenon can be reduced, thereby making the differential signal more complete. Through the common mode filter disposed symmetric to the differential signal lines and outside the differential signal lines, the filtering of the common-mode signal can be optimized without affecting the transmission of the differential signal.

What is claimed is:
1. A common mode filter comprising:
a substrate having a first surface, a second surface and a plurality of through holes, wherein the first surface and the second surface are opposite to each other, and the plurality of through holes each pass through the first surface and the second surface;
a first conductive layer disposed on the first surface of the substrate;
a ground layer disposed on the first surface of the substrate and spaced from the first conductive layer;
two conductive lines disposed on the second surface of the substrate, wherein one end of each of the two conductive lines is electrically connected to the first conductive layer through one of the plurality of through holes;
two passive components electrically connected to the ground layer and the first conductive layer; and
a second conductive layer disposed on the first surface of the substrate and spaced from the first conductive layer and the ground layer,
wherein another end of each of the two conductive lines is electrically connected to the second conductive layer through another one of the plurality of through holes.
2. The common mode filter of claim 1, wherein each of the two passive components comprises at least one of an inductor and a capacitor.
3. The common mode filter of claim 1, wherein the two conductive lines are mirror-symmetric to each other and the two passive components are mirror-symmetric to each other.
4. A signal transmission circuit comprising:
a common mode filter comprising:
a substrate having a first surface, a second surface and a plurality of through holes, wherein the first surface and the second surface are opposite to each other, and the plurality of through holes each pass through the first surface and the second surface;
a first conductive layer disposed on the first surface of the substrate;
a ground layer disposed on the first surface of the substrate and spaced from the first conductive layer;
two conductive lines disposed on the second surface of the substrate, wherein one end of each of the two conductive lines is electrically connected to the first conductive layer through one of the plurality of through holes;
two passive components electrically connected to the ground layer and the first conductive layer; and
a second conductive layer disposed on the first surface of the substrate and spaced from the first conductive layer and the ground layer, wherein another end of each of the two conductive lines is electrically connected to the second conductive layer through another one of the plurality of through holes, and two differential-signal lines disposed on the second surface of the substrate and located between the two conductive lines.

5. The signal transmission circuit of claim 4, wherein each of the two passive components comprises at least one of an inductor and a capacitor.

6. The signal transmission circuit of claim 4, wherein a path length of a coupling current traveling through one of the two conductive lines, one of the plurality of through holes, the first conductive layer and one of the two passive components is associated with a quarter of a wavelength of a signal transmitted by the two differential-signal lines.

7. The signal transmission circuit of claim 4, wherein the two differential-signal lines are mirror-symmetric to each other, the two conductive lines are mirror-symmetric to each other and the two passive components are mirror-symmetric to each other.

8. The signal transmission circuit of claim 4, wherein the two differential-signal lines and the two conductive lines are arranged with an equal interval.

* * * * *